US009629266B2

(12) United States Patent
Li et al.

(10) Patent No.: US 9,629,266 B2
(45) Date of Patent: Apr. 18, 2017

(54) MOUNTING DEVICE FOR DISPLAY MODULE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Zhan-Yang Li, Shenzhen (CN); Wen-Hu Lu, Shenzhen (CN); Po-Wen Chiu, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 1064 days.

(21) Appl. No.: 13/848,067

(22) Filed: Mar. 21, 2013

(65) Prior Publication Data
US 2013/0336715 A1    Dec. 19, 2013

(30) Foreign Application Priority Data

Jun. 15, 2012  (CN) .......................... 2012 1 0197877

(51) Int. Cl.
*H05K 5/02*    (2006.01)
*H05K 7/14*    (2006.01)
(52) U.S. Cl.
CPC ......... *H05K 5/0217* (2013.01); *H05K 7/1494* (2013.01); *Y10T 403/608* (2015.01)

(58) Field of Classification Search
CPC ...... H05K 5/02; H05K 5/0217; H05K 5/0221; H05K 7/14; H05K 7/1401; H05K 7/1422; H05K 7/1427; H05K 7/1461; Y10T 403/32557; Y10T 403/32565; Y10T 403/32861; Y10T 403/32918; Y10T 403/32319; Y10T 403/32262
See application file for complete search history.

(56) References Cited

U.S. PATENT DOCUMENTS 5,863,211 A * 1/1999 Sobotta ................... G06F 1/184
                                                                361/735
6,076,869 A * 6/2000 Chen ......................... E05C 3/14
                                                                292/128

(Continued)

*Primary Examiner* — Michael P Ferguson
(74) *Attorney, Agent, or Firm* — Steven M. Reiss

(57) ABSTRACT

A mounting device for a display module includes a positioning member and an installation member. The positioning member includes a limiting portion and a positioning piece. The limiting portion defines a first receiving slot. The positioning piece defines a cutout. The installation member is secured to the positioning member and includes an elastically deformable limiting block. The installation member defines a second receiving slot and a limiting slot. A limiting rib is located on the limiting block and in the limiting slot. The first receiving slot and the second receiving slot rotatably receive a rotating shaft of the display module therebetween. The limiting block abuts a connecting shaft connected to the rotating shaft and blocks the connecting shaft in the limiting slot. The cutout is adapted to receive the connecting shaft when the rotating shaft is rotated to rotate the connecting shaft out of the limiting slot.

12 Claims, 9 Drawing Sheets

(56) References Cited

U.S. PATENT DOCUMENTS

| | | | | |
|---|---|---|---|---|
| 6,421,252 B1* | 7/2002 | White | ............... | H05K 7/1429 174/377 |
| 6,546,584 B2* | 4/2003 | Hobden | ............... | B05C 17/00 15/144.1 |
| 7,375,952 B2* | 5/2008 | Tsai | ............... | H05K 5/0217 312/223.1 |
| 7,684,208 B2* | 3/2010 | Okamoto | ............ | H05K 7/1487 361/754 |

* cited by examiner

MOUNTING DEVICE FOR DISPLAY MODULE

BACKGROUND

1. Technical Field

The present disclosure relates to mounting devices, and particularly to a mounting device for a display module.

2. Description of Related Art

In a number of electronic apparatuses, such as servers, a display module reveals the working status for many electronic modules, such as graphics cards and hard disk drives, so that operators can see the real-time status of each electronic module. However, each display module is in a fixed position, which may not always be convenient for the operator. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
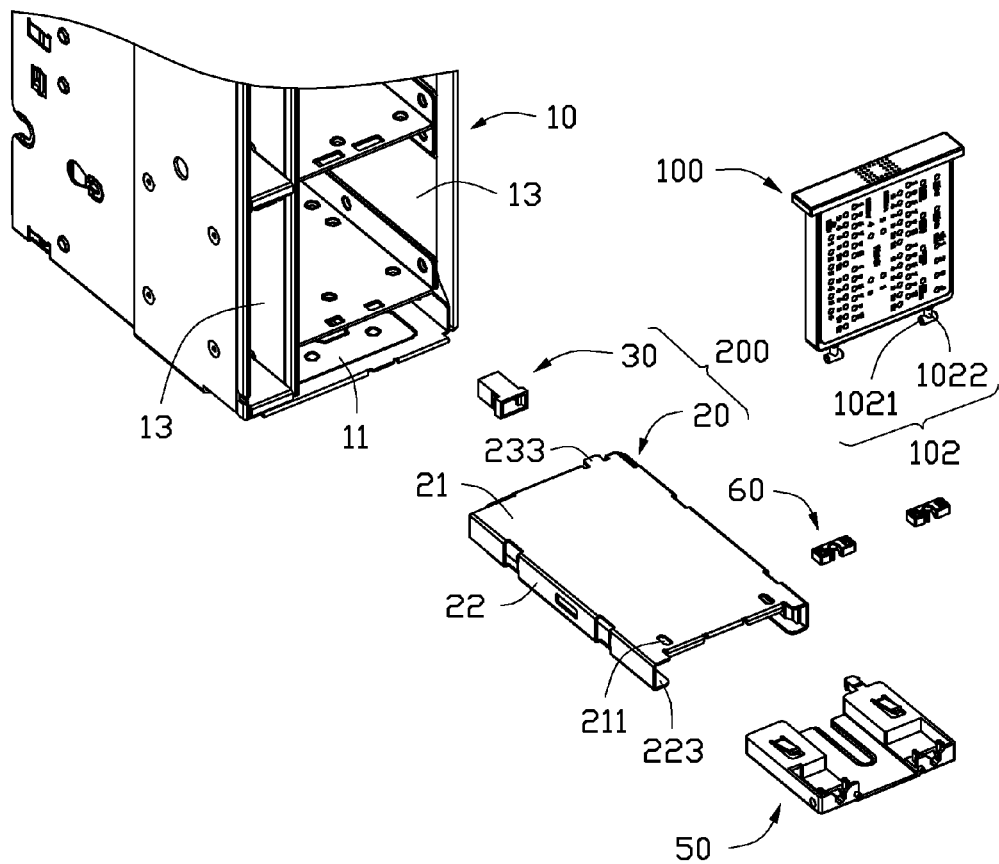
FIG. 1 is an exploded, isometric view of one embodiment of a mounting device and a display module.
Figure 2:
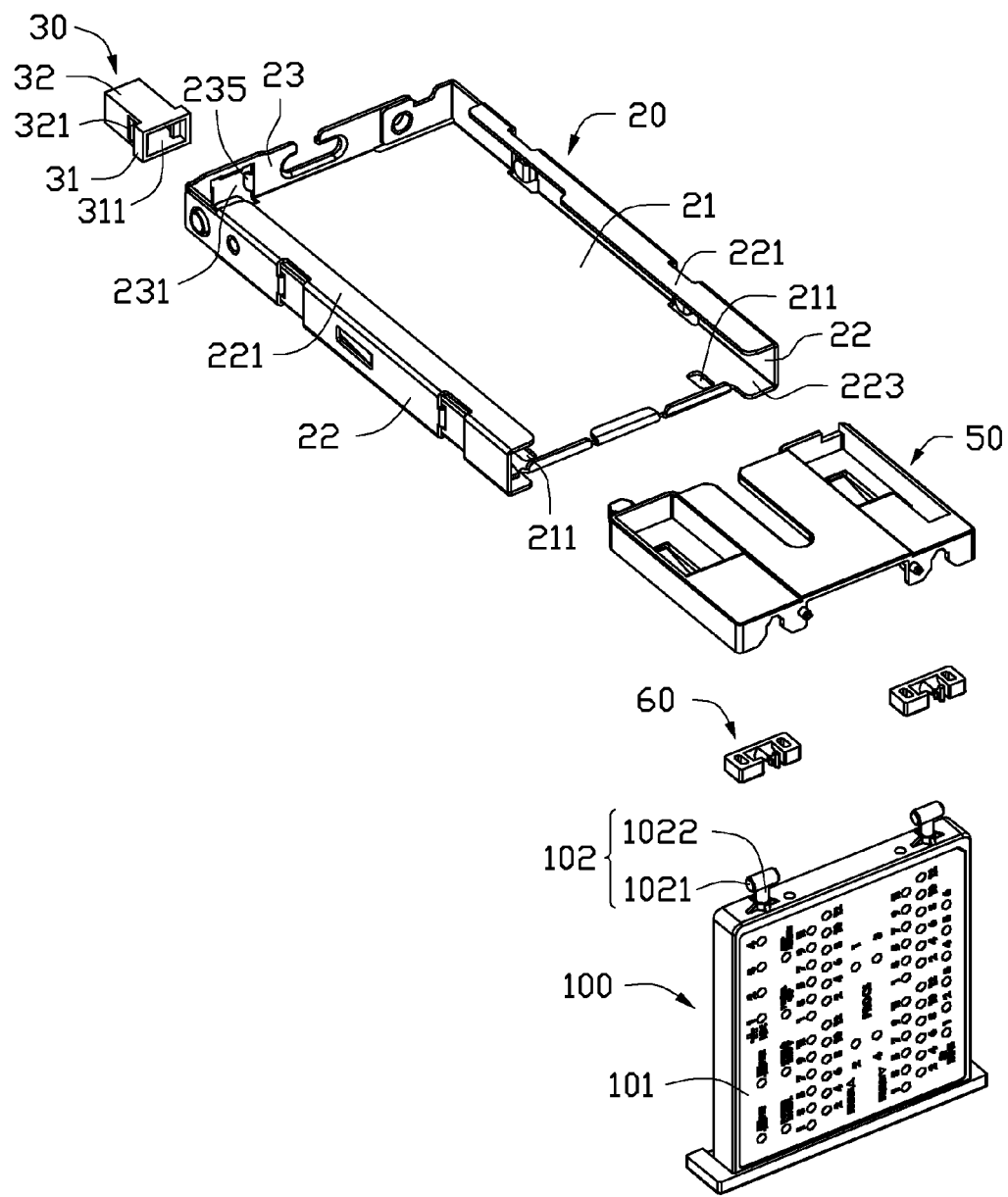
FIG. 2 is similar to FIG. 1, but viewed from a different aspect, and outside a chassis.

FIG. 1 and FIG. 2 show one embodiment of a mounting device for a display module 100. The mounting device includes a chassis 10, a mounting assembly 200, a positioning member 50, and an installation member 60.

The display module 100 includes a screen 101 and a rotating portion 102 connected to the screen 101. The rotating portion 102 includes a rotating shaft 1021 and a connecting shaft 1022 connected to the screen 101. In one embodiment, the rotating shaft 1021 is substantially perpendicular to the connecting shaft 1022.

The chassis 10 includes a bottom plate 11 and two side plates 13 extending substantially perpendicularly from the bottom plate 11.

The mounting assembly 200 includes a cage 20 and a mounting member 30.

The cage 20 includes a bottom wall 21, two sidewalls 22, and a front wall 23. In one embodiment, the bottom wall 21 is substantially perpendicular to the two sidewalls 22 and the front wall 23, and each of two sidewalls 22 is substantially perpendicular to the front wall 23. The front wall 23 extends from a first end of the bottom wall 21. A second end of the bottom wall 21, opposite to the front wall 23, defines two positioning holes 211. A flange 221 extends substantially perpendicularly inwardly from a top edge of each of the two sidewalls 22. A sliding rail 223 is defined by the arrangement of the flange 221, the sidewall 22, and the bottom wall 21. The front wall 23 defines an opening 231. A maintaining piece 233 extends from each of first two opposite edges of the opening 231, which is substantially parallel to the bottom wall 21. A blocking piece 235 extends from each of second two opposite edges of the opening 231, which is substantially perpendicular to the bottom wall 21. In one embodiment, the maintaining piece 233 is substantially perpendicular to the blocking piece 235.

The mounting member 30 includes a mounting portion 32 and a support portion 31. A width of the mounting portion 32 is smaller than a width of the support portion 31. The support portion 31 defines a mounting hole 311. A resilient piece 321 extends obliquely from each of two side surfaces of the mounting portion 32.

Figure 3:
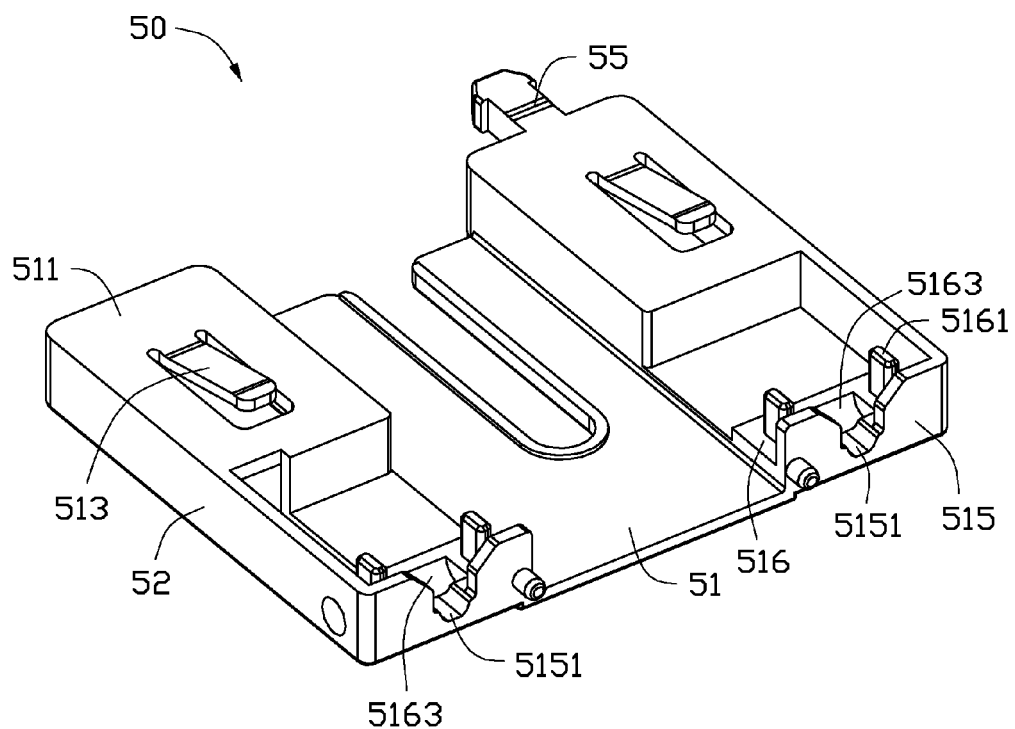
FIG. 3 is an isometric view of a positioning member of the mounting device of FIG. 1.
Figure 4:
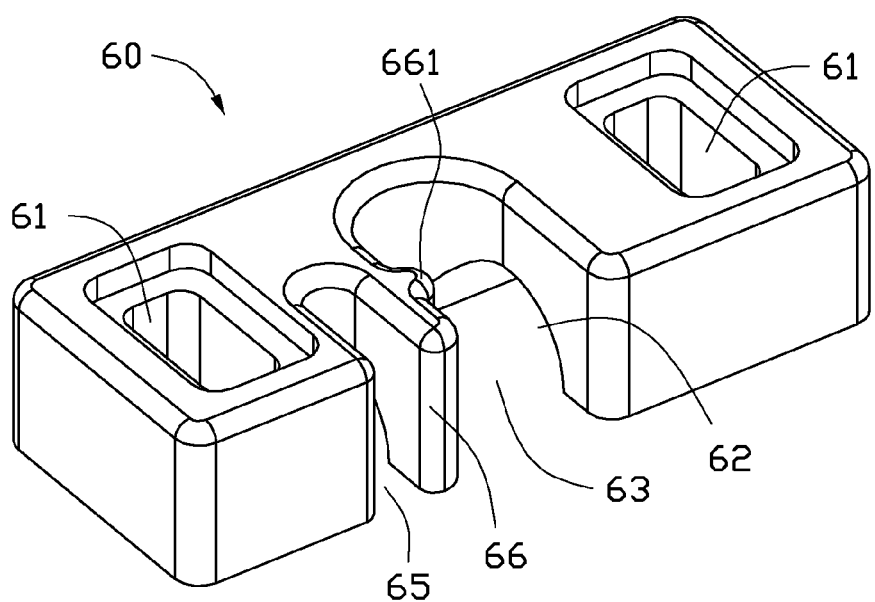
FIG. 4 is an isometric view of an installation member of the mounting device of FIG. 1.

FIG. 3 shows a positioning member 50 which includes a plate body 51 and two limiting plates 52 extending from opposite edges of the plate body 51. A distance between the two limiting plates 52 is less than a distance between the two sidewalls 22. In one embodiment, each of the two limiting plates 52 is substantially perpendicular to the plate body 51. Two positioning portions 511 extend from the plate body 51. Each positioning portion 511 is connected to one of the two limiting plates 52. A resisting piece 513 extends obliquely from a top surface of each positioning piece 511. Two positioning pieces 515 and a limiting portion 516 are located on the plate body 51. Each positioning piece 515 is connected to one of the two limiting plates 52 and the plate body 51. Each positioning piece 515 defines a cutout 5151. Two positioning blocks 5161 protrude from a top surface of each limiting portion 516. Each limiting portion 516 defines a first receiving slot 5163 communicating with the cutout 5151. An extending direction of the first receiving slot 5163 is substantially perpendicular to an extending direction of the cutout 5151. A latching portion 55 extends outwards from one of the two positioning portions 511. The latching portion 55 can engage in the mounting hole 311.

FIG. 3 shows the installation member 60 which defines two through holes 61. The installation member 60 defines a second receiving slot 62 extending from a bottom surface to a top surface of the installation member 60. The installation member 60 further defines a limiting slot 63 and an aperture 65. The limiting slot 63 and the aperture 65 communicate with the second receiving slot 62. An extending direction of each of the limiting slots 63 and the aperture 65 is substantially perpendicular to an extending direction of the second receiving slot 62. A limiting block 66 is located between the limiting slot 63 and the aperture 65. The limiting bock 66 is elastically deformable. A limiting rib 661 extends from the limiting block 66 and is located in the limiting slot 63. The limiting rib is above the second receiving slot 62.

Figure 5:
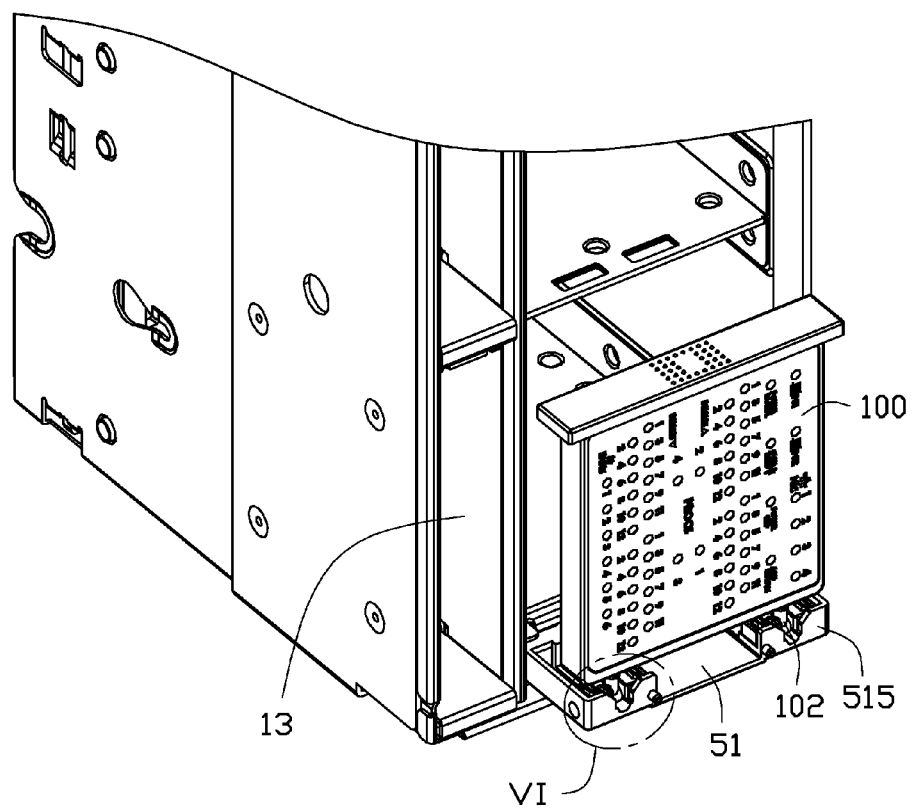
FIG. 5 is an assembled, isometric view of the mounting device and the display module of FIG. 1 in a first position.
Figure 6:
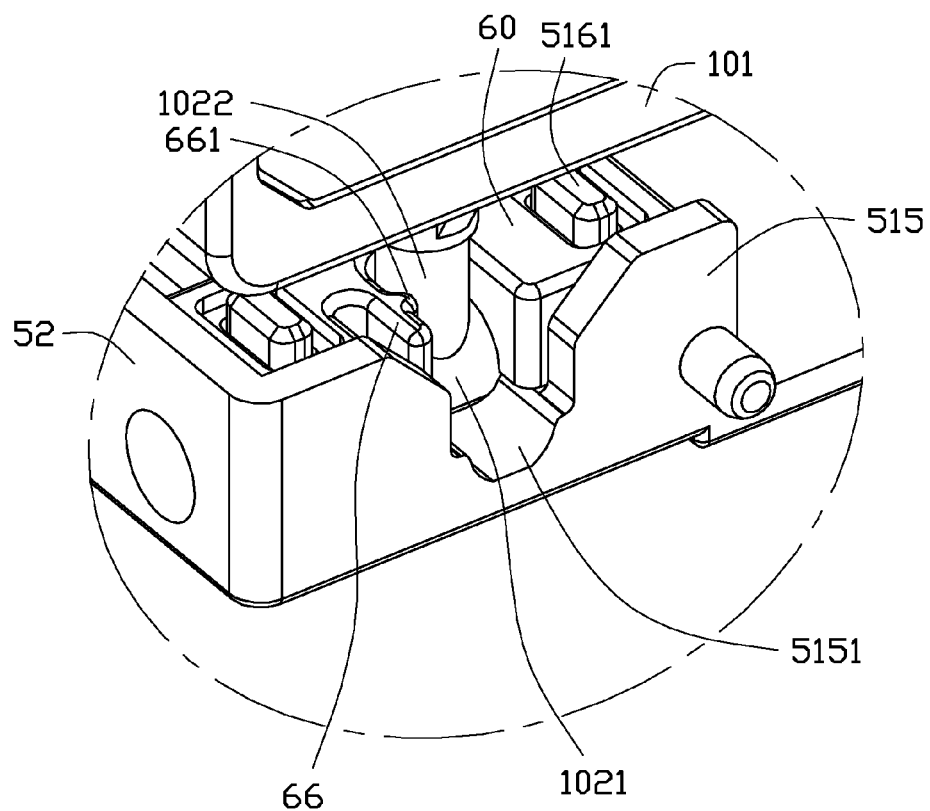
FIG. 6 is an enlarged view of a circled portion VI of the assembled mounting device and the display module of FIG. 1.
Figure 7:
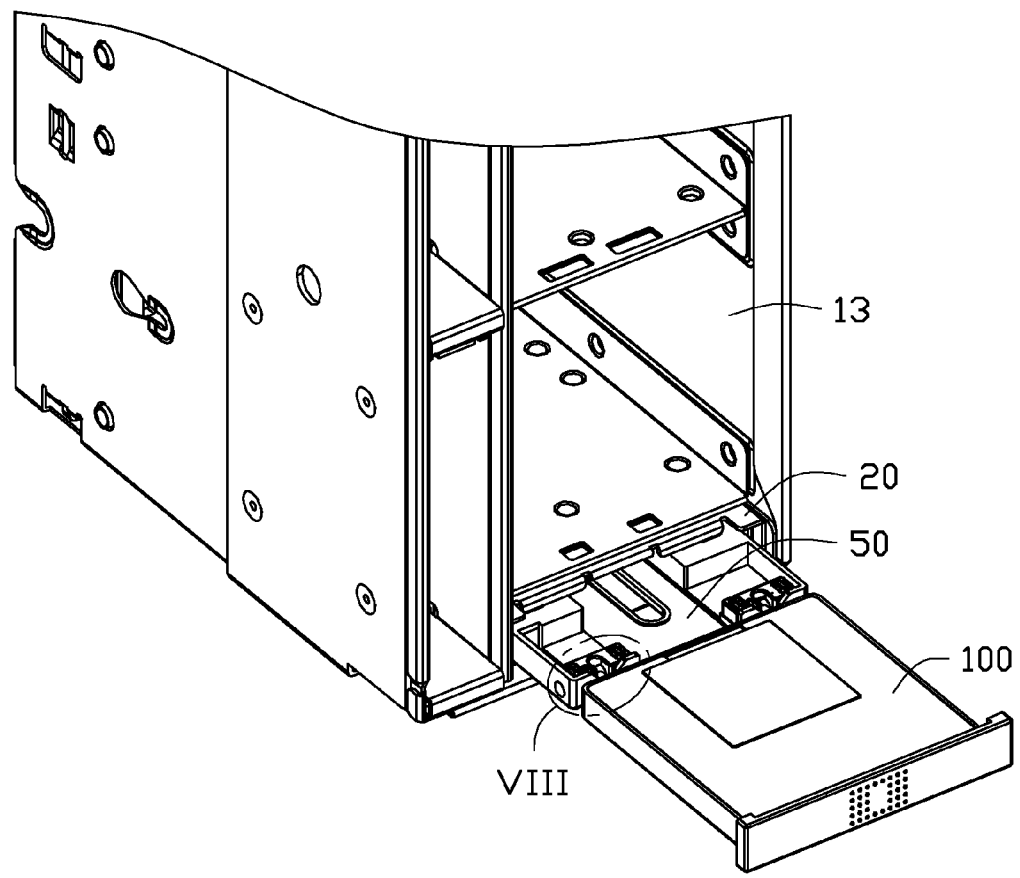
FIG. 7 is similar to FIG. 5, except that the display module is in a second position.
Figure 8:
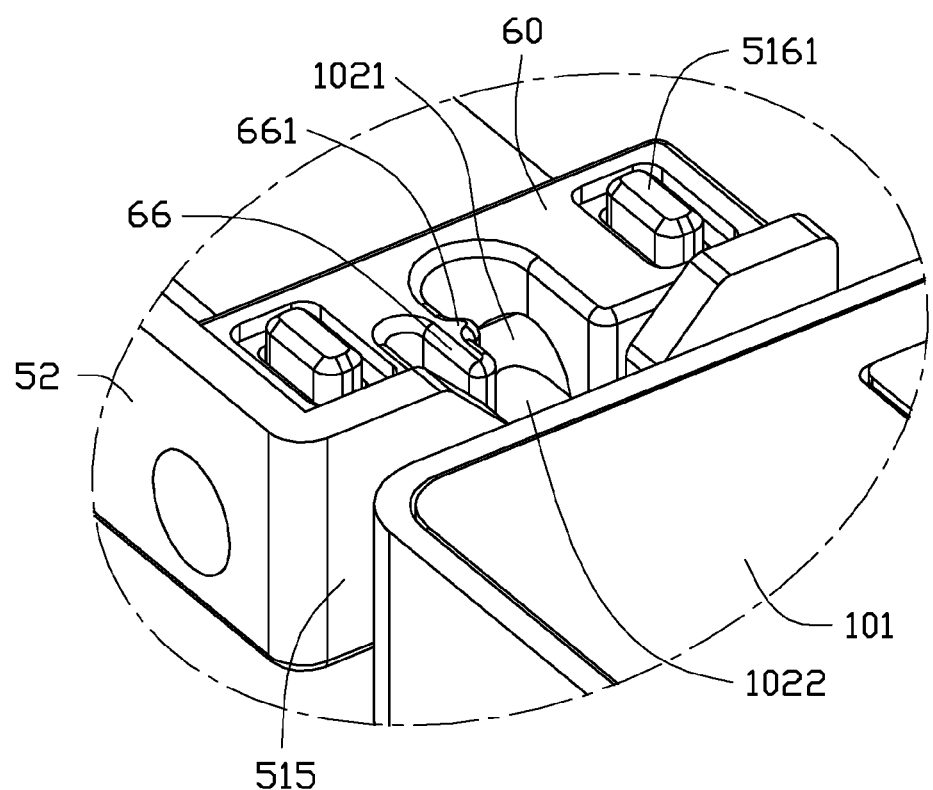
FIG. 8 is an enlarged view of a circled portion VIII of the assembled mounting device and the display module of FIG. 7.

FIG. 5 and FIG. 6 show that, in assembly, the mounting member 30 is positioned within the cage 20, and the mounting portion 32 is aligned with the opening 231. The mounting member 30 is moved to extend the mounting portion 32 out of the cage 20 through the opening 231. The mounting portion 32 is located between the two maintaining pieces 233. The resilient piece 321 is elastically deformed by the blocking piece 235, until the resilient piece 321 is moved over the blocking piece 235. In this position, the support portion 31 abuts an inner surface of the front wall 23, and the resilient piece 321 rebounds to abut an edge of the blocking piece 235. The mounting member 30 is thereby secured to the front wall 23.

The rotating shaft 1021 is positioned in the first receiving slot 5163. The installation member 60 is moved to align the limiting slot 63 with the connecting shaft 1022. The installation member 60 is pressed inward, so the limiting block 66 is elastically deformed towards the aperture 65. Until the connecting shaft 1022 is slid over the limiting rib 661, the limiting block 66 rebounds and the limiting rib 661 abuts a side end of the connecting shaft 1022, so as to engage the connecting shaft 1022 in the limiting slot 63. The through hole 61 is aligned with the positioning block 5161. The installation member 60 is moved further, until the positioning block 5161 is engaged in the through hole 61, and the rotating shaft 1021 is received in the second receiving slot 62. In this way, the rotating shaft 1021 is rotatably received in the first receiving slot 5163 and the second receiving slot 62.

Referring to FIGS. 5-8, the display module 100 is rotatable relative to the positioning member 50, between a first position and a second position. When the display module 100 is in the first position, the screen 101 is substantially perpendicular to the plate body 51, the limiting rib 551 abuts the side end of the connecting shaft 1022 and blocks the connecting shaft 1022 in the limiting slot 63. When the display module 100 is in the second position, the screen 101 is substantially parallel to the plate body 51, the limiting rib 551 abuts a top end of the rotating shaft 1021, and the connecting shaft 1022 is received in the cutout 5151. The display module 100 can be positioned in any position between the first and second positions, thereby allowing adjustability of the screen 101.

Figure 9:
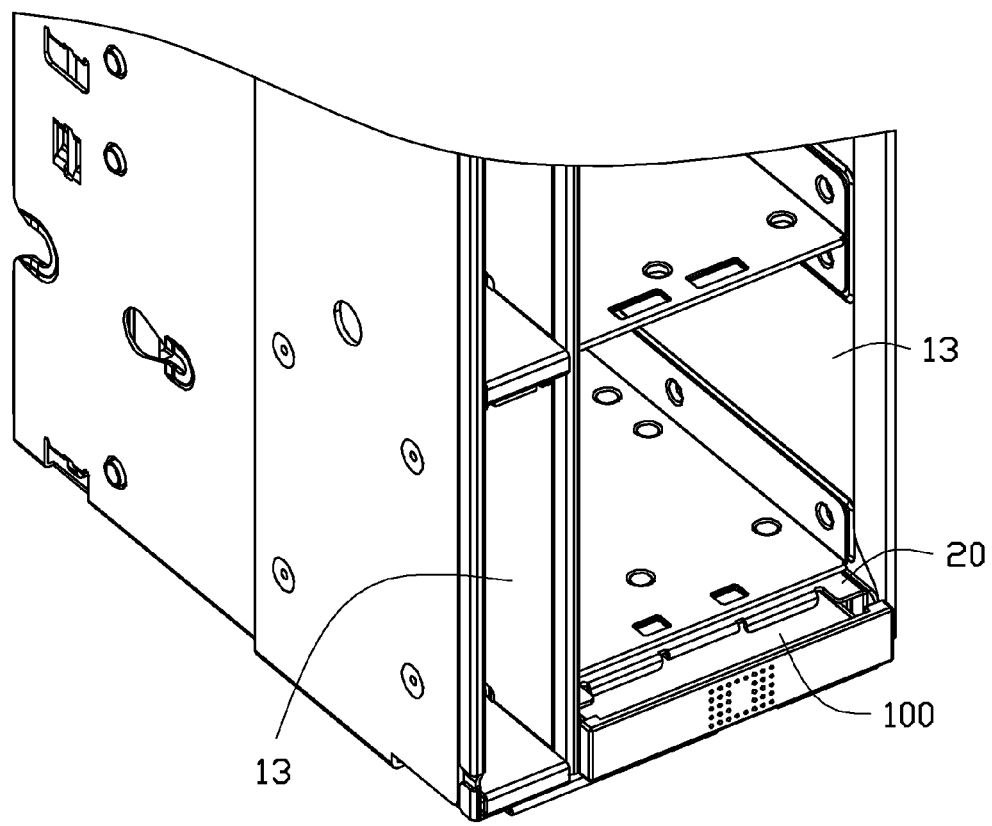
FIG. 9 is another assembled, isometric view of the mounting device and the display module of FIG. 1 received in a cage.

When the display module 100 is in the second position (see FIG. 9), the positioning member 50 is slid into the cage 20 along the two sliding rails 223, until the latching portion 55 engages in the mounting hole 311. Thus, the display module 100 is received in the cage 20. In this position, the resisting piece 513 is elastically deformable by pressing by the bottom wall 21.

When the display module 100 is desired, the display module 100 is pulled outwards to disengage the latching portion 55 from the mounting hole 311, until the resisting piece 513 is aligned with the positioning hole 211. The resisting piece 513 rebounds to engage in the positioning hole 211, and the display module 100 can be slid out of the cage 20. In this position, the screen 101 is in the second position. The screen 101 is rotatable between the first and second positions and to any angle in between.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and the arrangement of parts within the principles of the disclosure, to the full extent indicated by the broad general meaning of the terms in which the appended claims are expressed.

What is claimed is:

1. A mounting device for a display module, comprising:
a positioning member comprising a plate body, a limiting portion protruding from a top surface of the plate body, a positioning piece located on the plate body adjacent to the limiting portion and protruding outwards away from the to surface of the plate body, and two positioning blocks protruding from a top surface of the limiting portion; and
an installation member secured to the positioning member and comprising an elastically deformable limiting block and a limiting rib located on the elastically deformable limiting block, wherein the installation member defines two through holes, and the two positioning blocks are engaged in the two through holes to secure the positioning member to the installation member;
wherein the limiting portion defines a first receiving slot; and the positioning piece defines a cutout extending from a side of the first receiving slot; the first receiving slot communicating with the cutout, and an extending direction of the first receiving slot being substantially perpendicular to an extending direction of the cutout;
wherein the installation member defines a second receiving slot and a limiting slot adjacent to the second receiving slot; the limiting rib being located in the limiting slot; and an extending direction of the second receiving slot being substantially perpendicular to an extending direction of the limiting slot;
wherein the first receiving slot and the second receiving slot cooperatively define a slot loop adapted to rotatably receive a rotating shaft of the display module therein; the limiting rib being adapted to abut a connecting shaft, which is connected to the rotating shaft, and block the connecting shaft in the limiting slot to prevent the rotating shaft from rotating in the first receiving slot and the second receiving slot; and
wherein the cutout is adapted to receive the connecting shaft when the rotating shaft is rotated to rotate the connecting shaft out of the limiting slot; the limiting rib being above the second receiving slot, and abutting the rotating shaft when the display module is rotated to be substantially parallel to the plate body.

2. The mounting device of claim 1, wherein the positioning member further defines an aperture communicating with the second receiving slot, and the elastically deformable limiting block is located between the aperture and the limiting slot.

3. The mounting device of claim 1, further comprising a mounting assembly, wherein the mounting assembly comprises a cage and a mounting member; the cage comprises a bottom wall and a front wall extending from a first end of the bottom wall; a second end of the bottom wall defines a positioning hole; the mounting member is secured to the front wall; and the positioning member is slidable between the first end of the bottom wall and the second end of the bottom wall; and
wherein when the positioning member is in the first end of the bottom wall, the positioning member is secured to the mounting member; and when the positioning member is in the second end of the bottom wall, the positioning member is engaged in the positioning hole.

4. The mounting device of claim 3, wherein the positioning member further comprises a positioning portion extending from the plate body and a resisting piece extending obliquely from the positioning portion; and when the positioning member is in the second end of the bottom wall, the resisting piece is engaged in the positioning hole.

5. The mounting device of claim 4, wherein the mounting member defines a mounting hole; the positioning member further comprises a latching portion extending from the positioning portion away from the positioning piece; and when the positioning member is in the first end of the bottom wall, the latching portion is engaged in the mounting hole.

6. The mounting device of claim 3, wherein the front wall defines an opening; two maintaining pieces extend from a first two opposite edges of the opening, and two blocking pieces extend from a second two opposite edges of the opening; the mounting member comprises a mounting portion, two resilient pieces extending from the mounting portion, and a maintaining portion; the maintaining portion abuts an inner surface of the front wall; the mounting portion is in between the two maintaining pieces; and each of the two resilient pieces abuts an edge of each of the blocking pieces.

7. A mounting device for a display module, comprising:
a cage comprising a front wall and a bottom wall comprising a positioning hole therein;
a mounting member secured to the front wall at a first end of the bottom wall and comprising a mounting hole;
a positioning member comprising a plate body, a limiting portion disposed at one end of the positioning member, protruding from a top surface of the plate body and defining a first receiving slot, a resisting piece, a latching portion disposed at an opposing end of the positioning member, and two positioning blocks protruding from a top surface of the limiting portion; and
an installation member secured to the positioning member and comprising an elastically deformable limiting block and a limiting rib located on the elastically deformable limiting block, wherein the installation member defines two through holes, and the two positioning blocks are engaged in the two through holes to secure the positioning member to the installation member;
wherein the positioning hole is located in a second end of the bottom wall, which is opposite to the first end of the bottom wall; the positioning member being slidably disposed within the cage between the first end of the bottom wall and the second end of the bottom wall;
wherein when the positioning member is in the first end of the bottom wall of the cage, the positioning member is secured to the mounting member with the latching portion engaged in the mounting hole to receive the display module in the cage; and when the positioning member is in the second end of the bottom wall, the resisting piece is engaged in the positioning hole to move the display module out of the cage;
wherein the installation member defines a second receiving slot, and the first receiving slot and the second receiving slot cooperatively define a slot loop adapted to rotatably receive a rotating shaft of the display module therein; the limiting rib being adapted to abut a connecting shaft, which is connected to the rotating shaft, and block the connecting shaft to prevent the rotating shaft from rotating; and
wherein the limiting rib is above the second receiving slot, and the limiting rib abuts the rotating shaft when the display module is rotated to be substantially parallel to the plate body.

8. The mounting device of claim 7, wherein the installation member defines a limiting slot adjacent to the second receiving slot; the limiting rib being located in the limiting slot; and an extending direction of the second receiving slot is substantially perpendicular to an extending direction of the limiting slot;
wherein the positioning member further comprises a positioning piece connected to the limiting portion, located on the plate body adjacent to the limiting portion and protruding outwards away from the top surface of the plate body; and wherein the positioning piece defines a cutout extending from a side of the first receiving slot, the first receiving slot communicating with the cutout, and an extending direction of the first receiving slot being substantially perpendicular to an extending direction of the cutout; and
wherein the cutout is adapted to receive the connecting shaft when the rotating shaft is rotated to rotate the connecting shaft out of the limiting slot.

9. The mounting device of claim 8, wherein the positioning member further defines an aperture communicating with the second receiving slot, and the elastically deformable limiting block is between the aperture and the limiting slot.

10. The mounting device of claim 7, wherein the resisting piece extends obliquely from the positioning portion.

11. The mounting device of claim 10, wherein the latching portion extends from the positioning portion away from the positioning piece.

12. The mounting device of claim 7, wherein the front wall of the cage defines an opening; two maintaining pieces extend from a first two opposite edges of the opening, and two blocking pieces extend from a second two opposite edges of the opening; and
wherein the mounting member comprises a mounting portion, two resilient pieces extending from the mounting portion, and a maintaining portion; the maintaining portion abuts an inner surface of the front wall; the mounting portion is between the two maintaining pieces; and each of the two resilient pieces abuts an edge of each of the blocking pieces.

* * * * *